United States Patent [19]

Donnelly et al.

[11] 4,359,485
[45] Nov. 16, 1982

[54] RADIATION INDUCED DEPOSITION OF METAL ON SEMICONDUCTOR SURFACES

[75] Inventors: Vincent M. Donnelly, Berkeley Heights; Robert F. Karlicek, Jr., Kenilworth, both of N.J.

[73] Assignee: Bell Telephone Laboratories, Incorporated, Murray Hill, N.J.

[21] Appl. No.: 259,428

[22] Filed: May 1, 1981

[51] Int. Cl.$^3$ .............. B05D 1/18; B05D 3/06
[52] U.S. Cl. .............. 427/53.1; 427/88; 427/92
[58] Field of Search .............. 427/53.1, 54.1, 88, 427/92

[56] References Cited

U.S. PATENT DOCUMENTS

| | | | |
|---|---|---|---|
| 2,723,919 | 11/1955 | Pohnan | 427/42 |
| 4,009,297 | 2/1977 | Redmond et al. | 427/54.1 |
| 4,239,789 | 12/1980 | Blum et al. | 427/53.1 |
| 4,264,421 | 4/1981 | Bard et al. | 427/53.1 |
| 4,273,594 | 6/1981 | Heller et al. | 427/88 |
| 4,297,393 | 10/1981 | Denning et al. | 427/92 |
| 4,321,283 | 3/1982 | Patel et al. | 427/92 |

OTHER PUBLICATIONS

Ehrlich et al. "IEEE, Journal of Quantum Electronics" vol. QE-16, No. 11 (1980) pp. 1233-1242.
Cullis et al. "J. Phys. E: Sci. Instrum." vol. 12, pp. 688-689 (1979).
Deutsch et al. Applied Phys. Letters, vol. 36, #10, pp. 847-848, 5-1980.
Deutsch et al. Applied Phys. Letters, vol. 35, #2, pp. 175-176, 7-1979.
Ehrlich et al. Applied Phys. Letters, vol. 36, #11, pp. 916-918, 6-1980.

*Primary Examiner*—John H. Newsome
*Attorney, Agent, or Firm*—Michael J. Urbano

[57] ABSTRACT

A metal layer is formed on a surface of a Group III-V compound semiconductor by placing the surface in contact with a metal-containing solution and directing laser radiation through the solution. The radiation has a wavelength which is absorbed in the surface, thereby thermally inducing a chemical reaction between the surface and the solution and causing metal from the solution to be deposited on the surface. Specific examples of the deposition of Pt, Au and Zn on InP and GaAs are described.

14 Claims, No Drawings

RADIATION INDUCED DEPOSITION OF METAL ON SEMICONDUCTOR SURFACES

BACKGROUND OF THE INVENTION

This invention relates to the formation of metal layers on semiconductor bodies.

In the manufacture of semiconductor devices conventional techniques for depositing metal layers, such as electrical contacts, on semiconductor material include evaporation, sputtering and electroplating with evaporation being the most frequently used. One problem encountered is the formation of a rectifying junction between the metal layer and the semiconductor (e.g., between Au or Pt and GaAs) when an ohmic contact is desired. Conversion of the rectifying contact to an ohmic one is usually effected by an alloying procedure. Unfortunately, these procedures entail heating the entire semiconductor body of the device and can be detrimental to device performance. Another problem is that the spatial resolution (i.e., conductor linewidth) is limited by the resolution of masks used to pattern the metal layers.

Recently laser induced chemical reactions on semiconductor surfaces have received much attention for possible use in electronic device fabrication. Both laser induced deposition of metals on GaAs and laser induced etching of GaAs and InP have been reported. These investigations involve ultraviolet laser photolysis of gas phase organometallic (for metal depositions) and of gas and liquid phase halogen-containing compounds (for etching). In laser photolysis the laser radiation is absorbed by the gas/liquid phase causing the gas/liquid to decompose into molecular or atomic fragments. These fragments produced by irradiation migrate to the semiconductor surface where they react with the semiconductor material.

SUMMARY OF THE INVENTION

In accordance with our invention a metal layer is formed on a surface of Group III-V compound semiconductor body by placing the surface in contact with a solution containing a solvent and a metal-containing solute and irradiating the surface, through the solution, with optical radiation of a wavelength which is absorbed in the surface, thereby thermally inducing a chemical reaction between the surface and the solution and causing metal from the solute to be deposited on the surface. In a preferred embodiment, the optical wavelength is essentially transparent in the solution. This feature allows the use of lower power radiation sources and avoids complexities due to absorption in the solution.

Illustratively, the semiconductor body comprises InP or GaAs, the metal layer comprises Pt, Au, Ni, Zn or Zn-Au, the solvent comprises water or methanol and the solute comprises one or more metal salts, such as $H_2PtCl_6$, $HAuCl_4$, $NiSO_4$ or $ZnCl_2$. Moreover, the semiconductor surface may be n-type, p-type or unintentionally doped, and may be $<100>$ or $<111>$ oriented. In addition, the radiation source may take on a variety of forms; e.g., flash lamp, arc lamp or laser, as desired.

Our process of radiation induced deposition of metals on semiconductors offers several advantages over conventional metal deposition techniques (e.g., evaporation). When a laser is employed as the radiation source, these advantages include high spatial resolution and pattern definition without the need for masks (by scanning the laser beam or sample relative to one another). For the production of ohmic contacts, our invention has the feature that metal deposition and alloying of the metal/semiconductor interface occur simultaneously. In addition, because of the short penetration depth of the laser radiation, alloying occurs without subjecting the underlying portions of the semiconductor body to elevated temperatures. This aspect may be advantageous for applications where the high temperatures used for conventional alloying tend to degrade device performance.

Our invention, together with its various features and advantages, can be readily understood from the following more detailed description.

DETAILED DESCRIPTION

The following procedures were used for the laser-induced deposition of metals on InP and GaAs. Platinum, gold and nickel layers were deposited from aqueous chloroplatinic ($H_2PtCl_6$), chloroauric ($HAuCl_4$) and nickel sulfate ($NiSO_4$) solutions, respectively. Platinum, gold, zinc and zinc-gold layers were also deposited using methanol solutions of $H_2PtCl_6$, $HAuCl_4$, $ZnCl_2$ and $ZnCl_2$—$HAuCl_4$, respectively, in order to investigate the effect of solvent on the metallic deposition produced.

A dye laser (Lambda Physik Model FL2000, with model EMG 102 excimer laser pumping) was used to irradiate the semiconductor surface at normal incidence. The laser produced $\sim 10$ nsec pulses at a 10 Hz repetition rate and at energies as high as $\sim 5$ mJ/pulse. The operating wavelengths were chosen in the 580 nm to 720 nm region where the metal salt solutions do not absorb appreciably. The beam diameter was $\sim 1$ mm.

No attempt was made to homogenize the laser beam to eliminate hot spots and achieve a flat-top beam profile. For uniform deposition, however, a flat-top profile would be preferable and can be produced by techniques well-known in the art. See, for example, a paper by A. G. Gullis et al, *J. Phys. E., Sci. Instrum.*, 12, 689 (1979).

The laser-induced metal deposits were investigated using Normarski contrast optical microscopy, scanning electron microscopy (SEM), transmission electron microscopy (TEM), electron microprobe analysis, and Auger electron spectroscopy (AES).

EXAMPLES

Platinum, gold, and nickel deposits were produced on bromine-methanol polished InP substrates ($\sim 1$ cm$^2$ in area) by immersing the substrate (without further cleaning) in an $\sim 0.1$ M solution of the appropriate metal salt. Although the aqueous solutions of $H_2PtCl_6$ and $HAuCl_4$ are acidic (pH 1–2), no degradation of the InP surface due to dissolution or etch-pitting was observed. The immersed substrates were then irradiated with between 1 and 5000 laser pulses at energies ranging from $\sim 1.0$ to 5.0 mJ/pulse.

Measurements demonstrated that platinum, gold, nickel and zinc could be deposited on InP at incident pulse energies exceeding $\sim 2.0$ mJ/pulse ($\sim 0.2$ J/cm$^2$ with a 1 mm spot size which corresponds to $2 \times 10^7$ W/cm$^2$ for pulses of 10 nsec duration). Platinum deposition on GaAs was also observed under these conditions. The nature of the deposit was found to depend on the substrate material, the metal salt and the solvent. All deposits exhibited good adherence to the underlying substrate, resisting removal with adhesive-backed tape ("scotch tape" test).

PLATINUM ON InP

The deposition of platinum on InP from aqueous chloroplatinic acid solutions (0.1 M) was studied extensively. The platinum deposits on <100> InP were observed via a Normarski contrast optical micrograph which showed a dark spot at the center of the deposit. This spot was a ~30 μm deep crater produced by the high intensity at the center of the laser beam. The deposit was produced at an incident peak power density of the order of 200 MW/cm$^2$, well above the threshold for extensive surface damage. An electron microprobe analysis of the region surrounding the crater revealed the presence of In, P, and Pt. The nonuniform beam intensity profile used to produce metal deposits was evident from the morphological variety observed.

At lower incident peak power densities deposition was induced without the aforementioned gross surface damage. Under these conditions, platinum on <100> InP (independent of doping type or level) deposited from aqueous solutions in the form of crystallographically oriented rectangular islands. Both electron microprobe and depth profiled Auger analysis revealed that these deposits contained only platinum; oxygen and chlorine contamination were not detected. In all deposits in which rectangular island growth was observed, the edges of the rectangles were nearly parallel with the <110> InP cleavage plane. The size and number of platinum rectangular islands per unit area was dependent upon the incident energy density used to generate the deposit. Higher incident energy densities generated larger densities of smaller rectangular islands, which tended to grow together at beam center, forming a continuous layer. The formation of continuous platinum films usually required between 1,200 and 10,000 laser pulses (irradiation times of 2 minutes and 17 minutes, respectively, at a 10 Hz repetition rate), depending upon the incident energy density used to form the deposit.

At still lower laser peak power densities and/or shorter irradiation times (i.e., a fewer number of pulses), the initial stages of platinum deposition could be seen. One SEM micrograph showed platinum deposition at the edge of a larger platinum deposit which occurred in isolated rectangular islands and along a surface scratch in the InP substrate. Under similar conditions the deposition of platinum on <111> InP exhibited trigonal features suggesting that the substrate plays an important role in orienting the deposited platinum and in initiating deposition.

TEM examination of the interface between platinum deposited as a continuous layer revealed that platinum is initially deposited as polycrystalline PtP$_2$. The measured lattice parameter of the interfacial PtP$_2$ (cubic, a=5.82 Angstrom) was considerably larger than that observed for pure PtP$_2$ (cubic, a=5.69 Angstrom), but close to that of InP (cubic, a=5.87 Angstrom), suggesting that PtP$_2$ formed at the initial stages of platinum deposition attempts to lattice match the InP substrate. Other possible compounds which could occur in the interfacial region, such as elemental indium or platinum—indium alloys were not detected in the TEM examination.

Platinum was also deposited on InP from 0.1 M solutions of H$_2$PtCl$_6$ in methanol. The deposits were similar to those formed from aqueous solution at comparable laser power density levels. The formation of rectangular platinum islands, however, was not observed.

With certain optical configuration interference fringes were produced in the laser beam due to aperturing from lenses and irises used to define the beam shape. This pattern was replicated in the platinum deposit. Such nonuniform deposition could be eliminated by careful control of the imaging optics used to produce the deposit. However, the ability to replicate the fringes in the platinum illustrates the high degree of spatial resolution possible with this technique.

GOLD ON INP

Laser induced deposition of gold from both aqueous and methanolic 0.1 M solutions of HAuCl$_4$ was also observed. The deposition of gold from aqueous solutions exhibited a porous, grainy appearance. Methanolic solutions of HAuCl$_4$ produced smoother deposits than those produced from aqueous solutions. Gold rectangular island formation similar to that observed for platinum deposition was observed for gold deposits produced from methanolic solutions but not from aqueous solutions.

The deposition of gold on InP from both aqueous and methanolic solutions of HAuCl$_4$ occurred at a faster rate than was observed for platinum deposition from aqueous H$_2$PtCl$_6$ solutions. Generally it was found that under almost identical beam conditions, the formation of gold deposits required less than one-half the number of laser pulses required to form platinum deposits of comparable thickness. The deposited gold had exceptional adherence to the InP surfaces, i.e., it could not be scraped even with a metal tool.

NICKEL ON InP

Deposition of nickel on <100> InP from aqueous NiSO$_4$ 0.1 M solutions was also observed. The morphology of nickel on InP was similar to that observed for platinum at the incident beam power intensity of ~200 MW/cm$^2$. Crystallographically oriented deposits of nickel similar to those found for platinum and gold were not observed.

Platinum on GaAs

Platinum was deposited on n-type <100> GaAs from 0.1 M aqueous H$_2$PtCl$_6$ solutions. In contrast to platinum on <100> InP, platinum on <100> GaAs did not deposit in the form of rectangular islands.

ZINC ON InP

Zinc was deposited from an 0.1 M solution of ZnCl$_2$ in methanol on <100> oriented InP doped n-type with Sn to a net carrier concentration of ~10$^{17}$/cm$^3$. SEM examination of the zinc deposits revealed crystalographically oriented features similar to those observed at the initial stages of platinum deposition on <100> InP. The growth of zinc rectangular islands was not observed. Electron microprobe analysis revealed the presence of zinc, indium and phosphorus; no chlorine was detected.

ZINC/GOLD ON InP

Zinc and gold were co-deposited from an 0.1 M solution of ZnCl$_2$ and HAuCl$_4$ in methanol on <100> oriented InP doped n-type with Zn to a net carrier concentration of ~10$^{18}$/cm$^3$. Electrical characterization of these deposits indicated that rectifying contacts to the p-InP were produced. As with gold alone on InP, these zinc/gold deposits exhibited exceptional adherence to the InP surface.

CW LASER IRRADIATION

The foregoing examples were obtained with a pulsed dye laser. However, we found that continuous wave (CW) irradiation is also suitable. For example, the 600 mW output of a CW kryton ion laser was focused onto an InP surface in contact with an 0.1 M aqueous solution of chloroplatinic acid. Platinum deposition was observed.

ELECTRICAL MEASUREMENTS

Preliminary electrical characterization of platinum and gold deposits produced without surface damage on undoped <100> InP surfaces revealed that these deposits form ohmic contacts to the substrate. A curve tracer current-voltage characteristic between two laser deposited gold spots on an InP surface was measured. The linearity was excellent, particularly for contacts on undoped ($1.6 \times 10^{16}$ cm$^{-3}$), high resistivity (0.1395 $\Omega$cm) material on which it is usually difficult to form ohmic contacts by prior art techniques. As mentioned earlier, metal deposition via the chemical reaction between the surface and the solution and alloying of the metal/semiconductor interface occur simultaneously. The chemical reaction and alloying each imply that the power density of the radiation is sufficient to decompose the surface of the semiconductor.

MASKLESS PATTERN DEFINITION

To demonstrate that patterns could be defined in the metal layers without the need for masks (e.g., without photolithographic or similar procedures), we mounted one sample (InP substrate in contact with a 0.1 M methanolic HAuCl$_4$ solution) on a servomechanism which scanned the sample transverse to the laser beam path. Elongated metal conductors (2 mm wide × 1 cm long) were formed on the substrate.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, although 0.1 M solutions were described in the foregoing examples, a wide range of other concentrations can be employed. Lower concentrations tend to produce slower deposition rates but smoother metal layers, whereas higher concentrations tend to yield faster deposition rates and courser layers. We observed these characteristics, for example, in depositing platinum on InP using 0.01 M to 1.0 M solutions of chloroplatinic acid.

Moreover, while the foregoing examples demonstrate metal deposition on InP and GaAs, it will be apparent that our technique is equally applicable to other Group III-V compounds whether they be binary (e.g., GaSb), ternary (e.g., GaInAs, GaAlAs), quaternary (e.g., InGaAsP, GaAlInAs) or other alloys within this materials system.

As mentioned previously, the radiation source need not be a laser. For example, a high pressure mercury or xenon arc lamp or flash lamp could be used to thermally induce the reaction between the surface and the solution.

Finally, although the foregoing examples were performed with the semiconductor body at room temperature, we also contemplate that the body could be at a higher temperature (e.g., heated with a "hot plate") so as to enable the use of a lower intensity radiation source. In the foregoing examples, it should be noted that no reducing agent was added to the metal-containing solution. Indeed none is required in order to effect metal deposition.

What is claimed is:

1. A method of forming a metal layer on a surface of a Group III-V compound semiconductor body comprising the steps of
   (a) placing the surface in contact with a metal-containing solution; and
   (b) directing optical radiation through the solution to the surface, the radiation having a wavelength which is absorbed in the surface and a power density sufficient to thermally decompose said surface, thereby to thermally induce a chemical reaction between the solution and the surface and to cause metal from the solution to be deposited on the surface.

2. The method of claim 1 wherein the radiation has a wavelength which is essentially transparent in the solution.

3. The method of claim 1 wherein the solution contains metals selected from the group consisting of platinum, gold, nickel and zinc and combinations thereof.

4. The method of claims 1, 2 or 3 wherein the body comprises a semiconductor material selected from the group consisting of InP and GaAs.

5. The method of claim 1 wherein the solution comprises a solvent and a solute dissolved in the solvent and wherein the solute comprises a metal salt.

6. The method of claim 5 wherein the solvent is selected from the group consisting of water and methanol.

7. The method of claim 6 wherein the solute is selected from the group consisting of H$_2$PtCl$_6$, HAuCl$_4$, NiSO$_4$, and ZnCl$_2$ and combinations thereof.

8. The method of claim 7 wherein the metal salt has a concentration in the solution of approximately 0.01 M to 1.0 M.

9. The method of claims 1, 2, 3, 5, 6, 7 or 8 wherein in step (b) pulsed laser radiation is directed through the solution to the surface.

10. The method of claim 9 wherein the radiation has a power which is greater than approximately $10^7$ N/cm$^2$.

11. The method of claim 10 wherein the wavelength of the laser radiation is between approximately 580 and 720 nm.

12. The method of claims 1, 2, 3, 5, 6, 7 or 8 wherein the step (b) continuous wave-laser radiation is directed through the solution to the surface.

13. A method of forming a metal layer on a surface of a Group III-V compound semiconductor body including the steps of
   placing the surface in contact with a solution comprising a solvent selected from the group consisting of water and methanol and a solute comprising a metal salt, and
   directing laser radiation through the solution to the surface, the radiation having a wavelength which is essentially transparent in the solution but is absorbed in the surface, and the intensity of the radiation being sufficient to thermally decompose said surface thereby to induce a chemical reaction between the solution and the surface and cause metal from the solute to be deposited on the surface.

14. A method of forming a metal layer on a surface of a Group III-V compound semiconductor body comprising the steps of
(a) placing the surface in contact with a metal-containing solution which by itself causes essentially no deposition of metal on said surface, and
(b) directing optical radiation through the solution to the surface, the radiation having a wavelength which is absorbed in the surface and a power density sufficient to thermally decompose said surface, thereby to thermally induce a chemical reaction between the solution and the surface and to cause metal from the solution to be deposited on the surface.

* * * * *